United States Patent
Husson et al.

(10) Patent No.: US 9,257,153 B2
(45) Date of Patent: Feb. 9, 2016

(54) CURRENT MONITORING CIRCUIT FOR MEMORY WAKEUP TIME

(71) Applicant: Atmel Corporation, San Jose, CA (US)

(72) Inventors: Olivier Husson, Nantes (FR); Thierry Gourbilleau, Le Loroux-Bottereau (FR); Bernard Coloma, Nantes (FR)

(73) Assignee: Atmel Corporation, San Jose, CA (US)

( * ) Notice: Subject to any disclaimer, the term of this patent is extended or adjusted under 35 U.S.C. 154(b) by 301 days.

(21) Appl. No.: 13/798,991

(22) Filed: Mar. 13, 2013

(65) Prior Publication Data

US 2014/0085975 A1    Mar. 27, 2014

Related U.S. Application Data

(60) Provisional application No. 61/704,065, filed on Sep. 21, 2012.

(51) Int. Cl.
*G11C 5/14* (2006.01)
*G11C 11/40* (2006.01)
*G11C 7/04* (2006.01)

(52) U.S. Cl.
CPC *G11C 5/14* (2013.01); *G11C 5/148* (2013.01); *G11C 7/04* (2013.01); *G11C 11/40* (2013.01); *G11C 2207/2227* (2013.01); *G11C 2207/2254* (2013.01)

(58) Field of Classification Search
CPC ................................. G11C 5/14; G11C 5/141
USPC ............................... 365/277, 288, 299, 189, 9
See application file for complete search history.

(56) References Cited

U.S. PATENT DOCUMENTS

| | | | |
|---|---|---|---|
| 6,177,788 B1 | 1/2001 | Narendra et al. | |
| 6,424,128 B1 | 7/2002 | Hiraki et al. | |
| 6,507,523 B2 * | 1/2003 | Pekny | 365/189.09 |
| 6,798,275 B1 | 9/2004 | Le et al. | |
| 7,049,797 B2 | 5/2006 | Fukui et al. | |
| 7,995,047 B2 * | 8/2011 | Mizuki et al. | 345/204 |
| 2003/0151957 A1 | 8/2003 | Pekny | |
| 2004/0042319 A1* | 3/2004 | Lee | 365/226 |
| 2006/0255781 A1 | 11/2006 | Itoh | |
| 2007/0079147 A1 | 4/2007 | Pyeon et al. | |
| 2008/0024204 A1* | 1/2008 | Choy et al. | 327/538 |
| 2008/0136381 A1 | 6/2008 | Yang et al. | |
| 2008/0284402 A1 | 11/2008 | Ishino | |
| 2009/0044034 A1 | 2/2009 | Wong et al. | |
| 2011/0055594 A1 | 3/2011 | Wu | |

(Continued)

OTHER PUBLICATIONS

US Non-Final Office Action in U.S. Appl. No. 13/587,525, dated Jul. 16, 2014, 18 pages.

(Continued)

*Primary Examiner* — Huan Hoang
*Assistant Examiner* — Minh Dinh
(74) *Attorney, Agent, or Firm* — Fish & Richardson P.C.

(57) ABSTRACT

A microcontroller system is determining to exit a power saving mode and, in response, enable a reference current source to begin providing a reference current for a memory module. The microcontroller system determines that the reference current has reached a substantial fraction of a target reference current, and, in response to determining that the reference current has reached a substantial fraction of the target reference current, enables the memory module to begin performing one or more memory operations.

20 Claims, 3 Drawing Sheets

(56) References Cited

U.S. PATENT DOCUMENTS

2012/0194151 A1    8/2012    Gunther
2015/0009772 A1*  1/2015    Chen et al. .................... 365/227

OTHER PUBLICATIONS

US Final Office Action in U.S. Appl. No. 13/587,525, dated Jan. 9, 2015, 14 pages.

US Non-Final Office Action in U.S. Appl. No. 13/587,525, dated May 13, 2015, 21 pages.

US Non-Final Office Action in U.S. Appl. No. 13/603,155, dated Sep. 12, 2014, 17 pages.

US Final Office Action in U.S. Appl. No. 13/603,155, dated Jan. 16, 2015, 19 pages.

US Non-Final Office Action in U.S. Appl. No. 13/603,155, dated Sep. 10, 2015, 22 pages.

* cited by examiner

CURRENT MONITORING CIRCUIT FOR MEMORY WAKEUP TIME

CROSS-REFERENCE TO RELATED APPLICATIONS

This application claims the benefit and priority of U.S. Provisional Application Ser. No. 61/704,065, filed Sep. 21, 2012, the entire contents of which is hereby incorporated by reference.

TECHNICAL FIELD

This disclosure relates generally to electronics and more particularly to microcontroller systems.

BACKGROUND

Low power consumption is an increasingly important parameter for microcontroller systems. The wakeup time from a power saving mode is also an important parameter. Various components of the system can add to the time for the system to exit a power saving mode. For example, a memory module can increase the wakeup time from a power saving mode by waiting on a reference current source to reach a target reference current, which can vary depending on temperature or other environmental conditions or both.

Conventional systems rely on a system clock to determine how long it takes a reference current source to reach a target reference current. The length of time to wait for the reference current source is fixed based on a maximum estimated time for reaching the target reference current.

SUMMARY

A microcontroller system is determining to exit a power saving mode and, in response, enable a reference current source to begin providing a reference current for a memory module. The microcontroller system determines that the reference current has reached a substantial fraction of a target reference current, and, in response to determining that the reference current has reached a substantial fraction of the target reference current, enables the memory module to begin performing one or more memory operations.

Particular implementations of the microcontroller system can provide one or more of the following advantages: 1) the wakeup time of a memory module can be reduced; 2) power consumption can be reduced by virtue of not always having the reference current circuit active; and 3) the wakeup time can be tailored to the environmental conditions that affect the system.

The details of one or more disclosed implementations are set forth in the accompanying drawings and the description below. Other features, aspects, and advantages will become apparent from the description, the drawings and the claims.

DETAILED DESCRIPTION

System Overview

Figure 1:
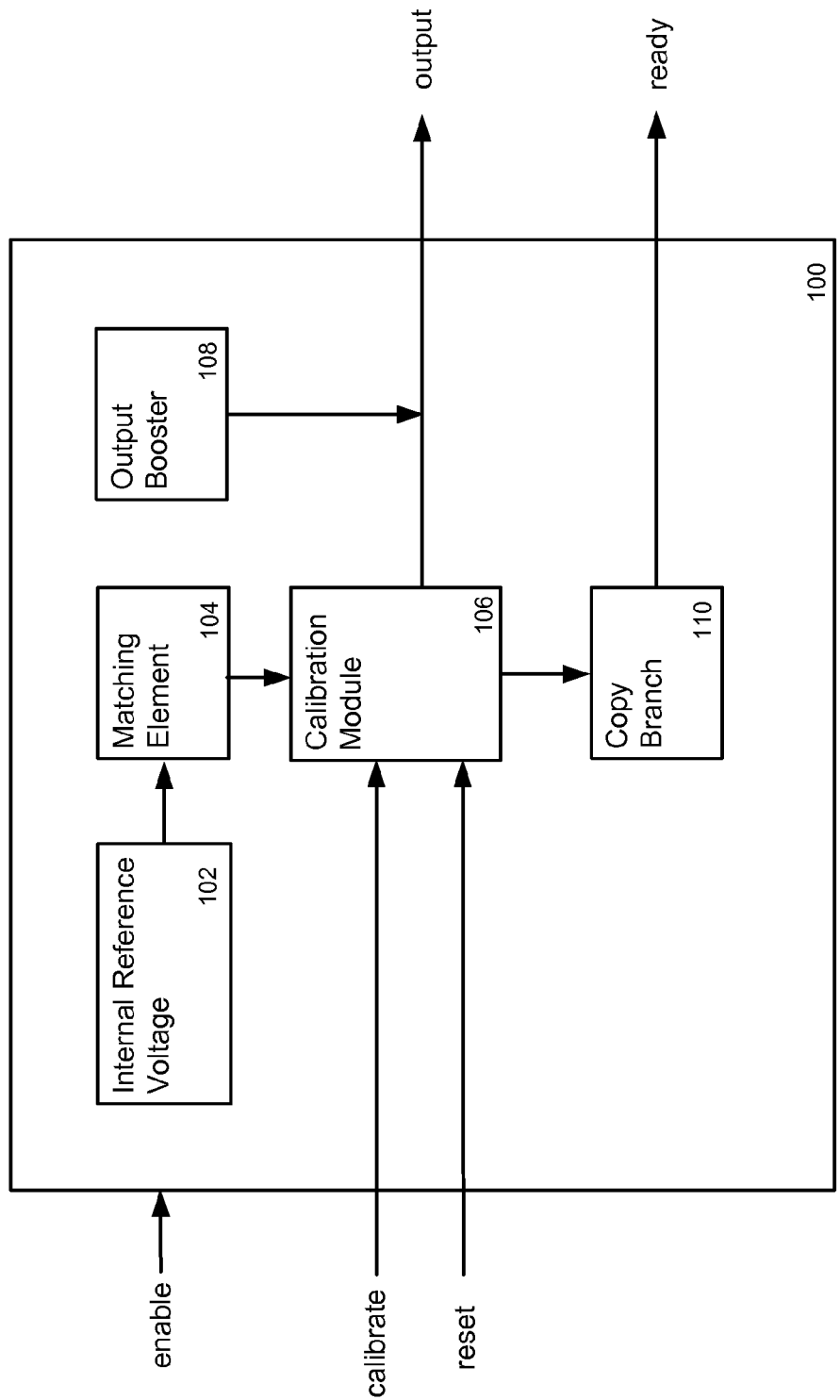
FIG. 1 is a block diagram of an example memory part of an example microcontroller system including a reference current circuit for a memory module.

FIG. 1 is a block diagram of an example memory part of an example microcontroller system including a reference current circuit 100 for a memory module. The example microcontroller system can be configured to operate in one or more power saving modes. The reference current is used, for example, to compare to the current from a memory cell to determine the state of the memory cell.

The reference current circuit can be, for example, internal to the memory module. In some implementations, the memory module is a flash memory module, and the reference current circuit is internal to the flash memory module. The flash memory module can also be configured to use an external reference current circuit. For example, the flash memory module can use the reference current circuit upon exiting a power saving mode, which the external reference current circuit is stabilizing.

To increase the wakeup speed of the memory module, it is useful to monitor the output of the reference current circuit and determine when the output reference current has reached a substantial fraction of a target reference current. The memory circuit can begin performing memory operations when the output reference current reaches the substantial fraction of the target reference current, instead of waiting, e.g., until a predetermined amount of time has passed. The output reference current will reach the substantial fraction of the target reference current in differing amounts of time due to differences in temperature and other environmental factors.

The reference current circuit includes an internal reference voltage 102. The internal reference voltage may produce a reference voltage of lower accuracy then a bandgap reference voltage with a slower wakeup time. The internal reference voltage is coupled to a matching element 104.

The matching element is matched to the memory cells of the memory module. For example, where the memory module is a flash memory module, the matching element can be a memory cell, from the same process as the other memory cells, lacking a floating gate. The matching element is used to compensate for process variations that may exist in the memory cells.

The matching element is coupled to a calibration module 106. The calibration module can multiply a current output from the matching element by a factor, e.g., to increase speed or reduce power consumption as needed. The factor can be received from the microcontroller by a "calibrate" signal. The calibration module also optionally receives a "reset" signal which can be used to reset the calibration module, e.g., cause the calibration module to reinitialize the output current.

The calibration module outputs the "output" reference current. Because the output is coupled to a capacitive load, it takes some time for the reference current to reach a target reference current when the system is exiting a power saving mode where the reference current is disabled. The capacitive load can be, for example, one or more sense amplifiers of the memory module. An optional output booster 108 is also coupled to the output and can be configured to output a pulse to decrease the time for the reference current to reach the target reference current.

The reference current circuit includes a copy branch 110 that generates a "ready" signal. The copy branch is configured so that the ready signal is set when the output reference current is at least a substantial fraction of a target reference current. The memory module can read the ready signal and then begin performing memory operations.

The copy branch is a mirror view of the circuitry for producing the output reference voltage, e.g., having a capacitive load about equal to the capacitive load at the output. The copy branch can include a comparator configured to determine whether the copy branch output is at least a substantial fraction of the target reference current. For example, the comparator can be a low power comparator using simplified circuitry.

Example Timing Diagram

Figure 2:
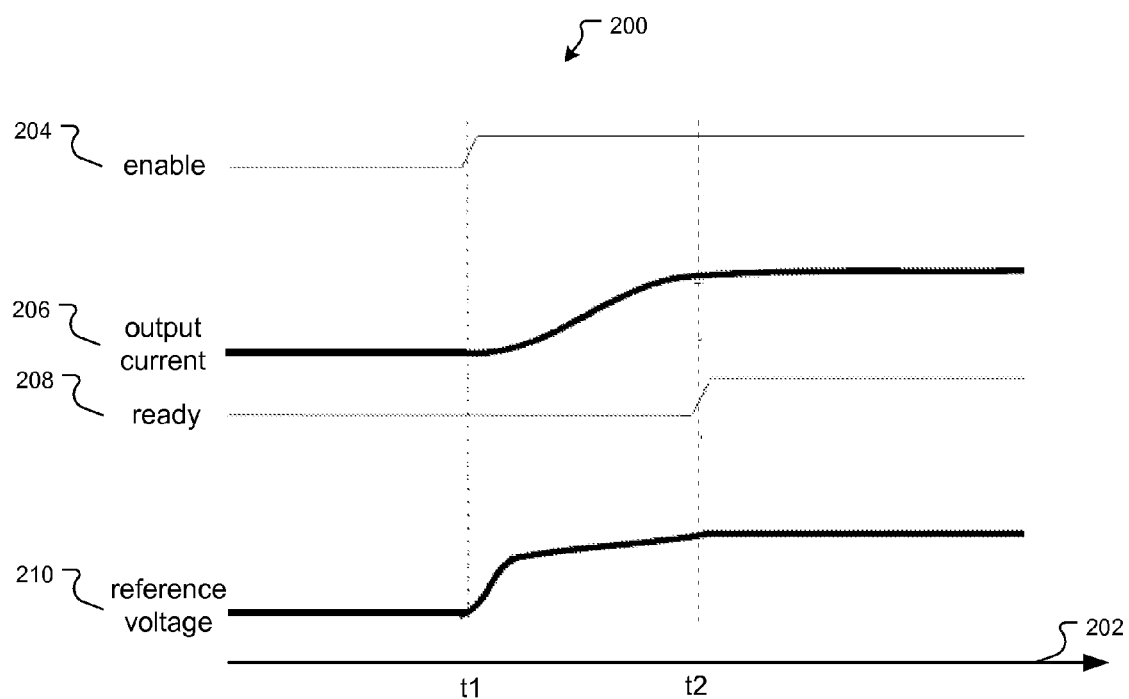
FIG. 2 is a timing diagram illustrating an example scenario of a microcontroller system exiting a power saving mode.

FIG. 2 is a timing diagram 200 illustrating an example scenario of a microcontroller system exiting a power saving mode. Events are illustrated along a timeline 202.

Prior to time t1, the system is in a power saving mode. The reference current circuit is disabled. At time t1, the system determines to exit the scenario. The enable signal rises and the output current starts rising while it charges a capacitive load. The read signal stays low, and the reference voltage rises quickly and then continues to rise while the output current charges the capacitive load.

At time t2, the output current reaches a substantial fraction of a target current. For example, the target current can be 20 micro amps, and the substantial fraction can be 90%. The ready signal rises as a result of monitoring the output current by a monitoring circuit, e.g., as described above with reference to FIG. 1. The memory module can then begin performing memory operations. After the output current reaches the substantial fraction of the target current, the system can disable monitoring the output current, e.g., to reduce power consumption.

Example Flowchart—Changing Power Configurations

Figure 3:
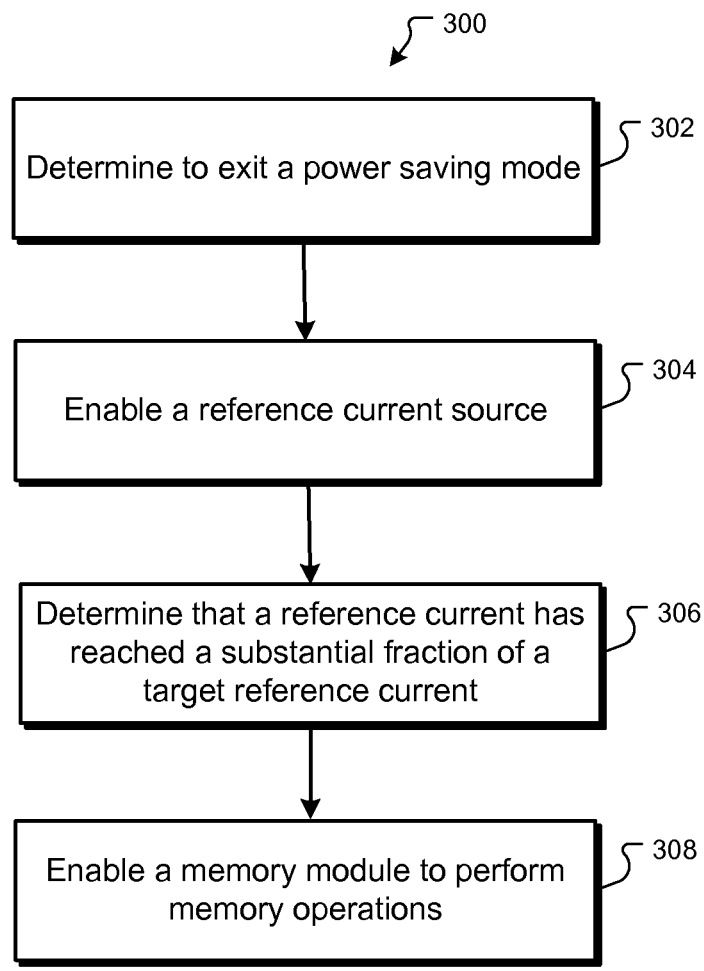
FIG. 3 is a flow diagram of an example process performed by a microcontroller system.

FIG. 3 is a flow diagram of an example process 300 performed by a microcontroller system.

The system determines to exit a power saving mode (302). For example, the system can receive a request from a user system requiring the system to activate one or more modules. In response, the system enables a reference current source for a memory module (304). The reference current source can be, for example, an internal reference current source inside the memory module that the memory module uses while a system voltage reference is waking up.

The system monitors the reference current from the reference current source and, determines that the reference current has reached at least a substantial fraction of the target reference current (308). For example, the system can monitor the reference current via a copy branch as described above with reference to FIG. 1. In response, the system enables the memory modules to being performing memory options using the reference current (310). The system can then disable monitoring the reference current and cause the memory module to a user a system reference voltage when the system reference voltage is available.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method performed by a microcontroller system, the method comprising:
    determining to exit a power saving mode and, in response, enabling a reference current source to begin providing a reference current for a memory module;
    monitoring the reference current by generating a copy reference current in a circuit branch parallel to a branch between the reference current source and the memory module;
    determining that the reference current has reached a substantial fraction of a target reference current by monitoring the reference current; and
    in response to determining that the reference current has reached a substantial fraction of the target reference current, enabling the memory module to begin performing one or more memory operations.

2. The method of claim 1, wherein enabling the reference current source comprises charging a capacitive load coupled to the reference current source.

3. The method of claim 2, wherein the capacitive load comprises one or more sense amplifiers of the memory module.

4. The method of claim 1, further comprising ceasing to monitor the reference current after enabling the memory module.

5. The method of claim 1, wherein the reference current source comprises:
    a reference voltage source;
    a matching element coupled to the reference voltage source; and
    a calibration module coupled to the matching element and a capacitive load of the memory module, the calibration module configured to multiply a current from the matching element by a calibration factor.

6. The method of claim 5, wherein the memory module is a flash memory module comprising a plurality of flash memory cells, and wherein the matching element is a flash memory cell lacking a floating gate.

7. The method of claim 5, wherein the reference voltage source is internal to the flash memory module.

8. The method of claim 5, wherein enabling the reference current source further comprises enabling a booster circuit coupled to the capacitive load and configured to charge the capacitive load.

9. The method of claim 1, wherein monitoring the reference current comprises determining whether the copy reference current has reached the substantial portion of the target reference current.

10. The method of claim 9, further comprising:
    in response to determining that the copy reference current has reached the substantial portion of the target reference current, generating a ready signal for the memory module.

11. A microcontroller system comprising:
    a memory module comprising a plurality of memory cells;
    a reference current source configured to provide a reference current to the memory module; and
    a control circuit configured to:
        determine to exit a power saving mode, the reference current source being disabled in the power saving mode;

upon determining to exit the power saving mode, enable the reference current source;

after enabling the reference current source, determine that the reference current is a substantial fraction of a target reference current, and in response, enable the memory module to perform one or more memory operations using the reference current, wherein the control circuit includes a monitoring circuit configured to monitor the reference current by generating a copy reference current in a circuit branch parallel to a branch between the reference current source and the memory cells of the memory module, and wherein the control circuit is configured to determine that the reference current has reached a substantial fraction of the target reference current by monitoring the reference current.

12. The microcontroller system of claim 11, wherein enabling the reference current source comprises charging a capacitive load coupled to the reference current source.

13. The microcontroller system of claim 11, wherein the capacitive load comprises one or more sense amplifiers of the memory module.

14. The microcontroller system of claim 11, wherein the control circuit is configured to cease monitoring the reference current after enabling the memory module.

15. The microcontroller system of claim 11, wherein the reference current source comprises:

a reference voltage source;

a matching element coupled to the reference voltage source; and a calibration module coupled to the matching element and a capacitive load of the memory module, the calibration module configured to multiply a current from the matching element by a calibration factor.

16. The microcontroller system of claim 15, wherein the memory module is a flash memory module comprising a plurality of flash memory cells, and wherein the matching element is a flash memory cell lacking a floating gate.

17. The microcontroller system of claim 15, wherein the reference voltage source is internal to the flash memory module.

18. The microcontroller system of claim 15, wherein enabling the reference current source further comprises enabling a booster circuit coupled to the capacitive load and configured to charge the capacitive load.

19. The microcontroller system of claim 11, wherein the circuit branch comprises a comparator configured to determine whether the copy reference current has reached the substantial portion of the target reference current.

20. The microcontroller system of claim 19, wherein the circuit branch is configured to generate a ready signal for the memory module in response to determining that the copy reference current has reached the substantial portion of the target reference current.

* * * * *